(12) United States Patent
Urban et al.

(10) Patent No.: US 9,882,108 B2
(45) Date of Patent: Jan. 30, 2018

(54) NANOSTRUCTURED LAYERS OF THERMOELECTRIC MATERIALS

(71) Applicants: Jeffrey J. Urban, Emeryville, CA (US); Jared Lynch, Fremont, CA (US); Nelson Coates, Oakland, CA (US); Jason Forster, Berkeley, CA (US); Ayaskanta Sahu, Berkeley, CA (US); Michael Chabinyc, Santa Barbara, CA (US); Boris Russ, Berkeley, CA (US)

(72) Inventors: Jeffrey J. Urban, Emeryville, CA (US); Jared Lynch, Fremont, CA (US); Nelson Coates, Oakland, CA (US); Jason Forster, Berkeley, CA (US); Ayaskanta Sahu, Berkeley, CA (US); Michael Chabinyc, Santa Barbara, CA (US); Boris Russ, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/254,412

(22) Filed: Sep. 1, 2016

(65) Prior Publication Data

US 2017/0069813 A1    Mar. 9, 2017

Related U.S. Application Data

(60) Provisional application No. 62/215,352, filed on Sep. 8, 2015, provisional application No. 62/247,310, filed on (Continued)

(51) Int. Cl.
*H01L 35/16* (2006.01)
*H01L 35/34* (2006.01)
(Continued)

(52) U.S. Cl.
CPC ............ *H01L 35/16* (2013.01); *C01B 19/007* (2013.01); *C09D 1/00* (2013.01); *C09D 5/24* (2013.01);
(Continued)

(58) Field of Classification Search
CPC ......... H01L 35/00; H01L 35/02; H01L 35/12; H01L 35/14; H01L 35/16; H01L 35/28;
(Continued)

(56) References Cited

U.S. PATENT DOCUMENTS 6,759,587 B2    7/2004  Toshima et al.
7,267,875 B2    9/2007  Whiteford et al.
(Continued)

OTHER PUBLICATIONS

Lynch, J., et al. Ligand Coupling Symmetry Correlates with Thermopower Enhancement in Small-Molecule/Nanocrystal Hybrid Materials. ACS Nano 8, 10528-10536 (2014).
(Continued)

*Primary Examiner* — Scott B Geyer

(57) ABSTRACT

This disclosure provides systems, methods, and apparatus related to thermoelectric materials. In one aspect, a method includes providing a plurality of nanostructures. The plurality of nanostructures comprise a thermoelectric material, with each nanostructure of the plurality of nanostructures having first ligands disposed on a surface of the nanostructure. The plurality of nanostructures is mixed with a solution containing second ligands and a ligand exchange process occurs in which the first ligands disposed on the plurality of nanostructures are replaced with the second ligands. The plurality of nanostructures is deposited on a substrate to form a layer. The layer is thermally annealed.

19 Claims, 8 Drawing Sheets

Related U.S. Application Data on Oct. 28, 2015, provisional application No. 62/256,786, filed on Nov. 18, 2015, provisional application No. 62/333,409, filed on May 9, 2016.

(51) Int. Cl.
  *H01L 35/02* (2006.01)
  *C01B 19/00* (2006.01)
  *C09D 1/00* (2006.01)
  *C09D 5/26* (2006.01)
  *C09D 5/24* (2006.01)

(52) U.S. Cl.
  CPC ............... *C09D 5/26* (2013.01); *H01L 35/02* (2013.01); *H01L 35/34* (2013.01); *C01P 2004/16* (2013.01); *C01P 2004/64* (2013.01); *C01P 2006/40* (2013.01)

(58) Field of Classification Search
  CPC .. H01L 35/34; C01P 2004/13; C01P 2004/16; C01P 2004/17; C01P 2004/24; C01P 2004/64; C01P 2006/40
  See application file for complete search history.

(56) References Cited

U.S. PATENT DOCUMENTS

| | | |
|---|---|---|
| 7,585,564 B2 | 9/2009 | Whiteford et al. |
| 8,067,259 B2 | 11/2011 | Landry et al. |
| 8,492,643 B2 | 7/2013 | Lee et al. |
| 8,563,133 B2 | 10/2013 | Whiteford et al. |
| 8,604,331 B2 | 12/2013 | Rhyee et al. |
| 9,065,014 B2 | 6/2015 | Kim et al. |
| 9,130,066 B2 | 9/2015 | Hwang et al. |
| 9,149,836 B2 | 10/2015 | Whiteford et al. |
| 9,227,846 B2 * | 1/2016 | Peng ...................... C01B 19/04 |
| 2013/0084464 A1 * | 4/2013 | See .......................... H01L 35/24 428/626 |
| 2014/0241977 A1 * | 8/2014 | Peng ...................... C01B 19/04 423/509 |
| 2015/0311418 A1 * | 10/2015 | Ballinger ................ H01L 35/34 252/62.3 T |

OTHER PUBLICATIONS

Urban, J.J. Prospects for thermoelectricity in quantum dot hybrid arrays. Nature Nanotechnology 10, 997 (Dec. 2015).
Wang, R. Y., et al. Enhanced Thermopower in PbSe Nanocrystal Quantum Dot Superlattices. Nano Lett. 2008, 8, 2283-2288.
Kato, K., et al. Fabrication of Bismuth Telluride Thermoelectric Films Containing Conductive Polymers Using a Printing Method. J. Electron. Mater. 2013, 42, 1313-1318.
Kriegel, I, et al., "Tuning the Excitonic and Plasmonic Properties of Copper Chalcogenide Nanocrystals," J. Am. Chem.Soc. 2012, 134, 1583-1590.
Liu, H., et al., "Copper ion liquid-like thermoelectrics," Nature Materials 11, May 2012, 422-425.
Bell, L. E. Cooling, heating, generating power, and recovering waste heat with thermoelectric systems. Science 321, 1457-1461 (2008).
Coates, N. E. et al. Effect of interfacial properties on polymer-nanocrystal thermoelectric transport. Adv. Mater. 25, 1629-1633 (2013).
Zhuge, F. et al. Modulation of thermoelectric power factor via radial dopant inhomogeneity in B-doped Si nanowires. J. Amer. Chem. Soc. 136, 14100-14106 (2014).
Nag, A. et al. Metal-free inorganic ligands for colloidal nanocrystals: S2-, HS-, Se2-, HSe-, Te2-, HTe-, TeS32-, OH-, and NH2- as surface ligands. J. Amer. Chem. Soc. 133, 10612-10620 (2011).
Heremans, J. P. et al. Enhancement of thermoelectric efficiency in PbTe by distortion of the electronic density of states. Science 321, 554-557 (2008).
Yu, B. et al. Enhancement of thermoelectric properties by modulation-doping in silicon germanium alloy nanocomposites. Nano Lett. 12, 2077-2082 (2012).
Murray, C. B. et al. Synthesis and characterization of monodisperse nanocrystals and close-packed nanocrystal assemblies. Annu. Rev. Mater. Sci. 30, 545-610 (2000).
Rogers, J. A., et al. Materials and mechanics for stretchable electronics. Science 327, 1603-1607(2010).
Fang, H., et al. The effects of the size and the doping concentration on the power factor of n-type lead telluride nanocrystals for thermoelectric energy conversion. Nano Lett. 14, 1153-1157 (2014).
Yang, H. et al. Enhanced thermoelectric properties in bulk nanowire heterostructure-based nanocomposites through minority carrier blocking. Nano Lett. 15, 1349-1355 (2015).
Scheele, M. et al. Synthesis and thermoelectric characterization of Bi2Te3 nanoparticles. Adv. Funct. Mater. 19, 3476-3483 (2009).
Zhang, G. et al. Rational synthesis of ultrathin n-type Bi2Te3 nanowires with enhanced thermoelectric properties. Nano Lett. 12, 56-60 (2011).
Zhang, G. Q. et al. Design principle of telluride-based nanowire heterostructures for potential thermoelectric applications. Nano Lett. 12, 3627-3633 (2012).
Zhang, Q. et al. High thermoelectric performance by resonant dopant indium in nanostructured SnTe. Proc. Natl. Acad. Sci. USA 110, 13261-13266, (2013).
Talapin, D. V. & Murray, C. B. PbSe nanocrystal solids for n- and p-channel thin film field-effect transistors. Science 310, 86-89, (2005).
Chuang, C.-H. M., et al. Improved performance and stability in quantum dot solar cells through band alignment engineering. Nature Mater. 13, 796-801 (2014).
Sahu, A., et al. Interface Engineering for High Performance Thermo-electric Nanocomposites, AIChE Annual Meeting, Nov. 20, 2014.
Sahu, A., et al. Interface Engineering for High Performance Thermoelectric Nanocomposites, MRS Fall 2014 Meeting, Dec. 4, 2014.
Snyder, G.J., et al. Improved thermoelectric cooling based on the Thomson effect. Physical Review B 86, 045202 (2012).

\* cited by examiner

NANOSTRUCTURED LAYERS OF THERMOELECTRIC MATERIALS

RELATED APPLICATIONS

This application claims priority to U.S. Provisional Patent Application Ser. No. 62/215,352, filed Sep. 8, 2015, to U.S. Provisional Patent Application Ser. No. 62/247,310, filed Oct. 28, 2015, to U.S. Provisional Patent Application Ser. No. 62/256,786, filed Nov. 18, 2015, and to U.S. Provisional Patent Application Ser. No. 62/333,409, filed May 9, 2016, all of which are herein incorporated by reference.

STATEMENT OF GOVERNMENT SUPPORT

This invention was made with government support under Contract No. DE-AC02-05CH11231 awarded by the U.S. Department of Energy and under Grant No. FA9550-12-1-0002 awarded by the Air Force Office of Scientific Research. The government has certain rights in this invention.

TECHNICAL FIELD

This disclosure relates generally to thermoelectric materials.

BACKGROUND

Performance of thermoelectric materials is quantified by a dimensionless thermoelectric figure of merit, $ZT=S^2 \times \sigma \times T/\lambda$, where S is the Seebeck coefficient, $\sigma$ is the electrical conductivity, T is the temperature, and $\lambda$ is the thermal conductivity. The term $S^2 \times \sigma$ is known as the power factor. Increasing the numerator or decreasing the denominator of ZT will improve the performance of a thermoelectric material. Historically, the focus has been on reducing the thermal conductivity because in bulk materials, the Seebeck coefficient and the electrical conductivity are inversely coupled. Nanostructuring of bulk thermoelectric materials has enabled the lowering of the thermal conductivity. This strategy has been performed using energy intensive techniques (e.g., spark plasma sintering (SPS)).

SUMMARY

An alternative strategy to producing nanostructured thermoelectric materials with properties comparable to those of bulk materials of the same composition is described herein. The method involves mild thermal annealing of thin films or layers of solution-processed inorganic nanomaterials. A simultaneous increase in both the Seebeck coefficient and the thermal conductivity through an annealing process, which retains the nanoscale material features that are beneficial for thermal conductivity reductions by avoiding macroscale sintering and grain growth, has been demonstrated. The annealing process also leads to molecular electronic coupling, resulting in high power factors. Further, this method allows for facile film transfer from the original substrate to another substrate. The thermoelectric material design strategy is compatible with any solution-based nanoscale active material, including inorganic, organic, and hybrid organic/inorganic/molecular components.

In some embodiments, copper selenide ($Cu_2Se$) nanoparticle films were treated by thermal annealing. The thermal annealing increased the electric conductivity and Seebeck coefficient of the $Cu_2Se$ nanoparticle films.

One innovative aspect of the subject matter described in this disclosure can be implemented in a method including providing a plurality of nanostructures. The plurality of nanostructures comprise a thermoelectric material, with each nanostructure of the plurality of nanostructures having first ligands disposed on a surface of the nanostructure. The plurality of nanostructures is mixed with a solution containing second ligands and a ligand exchange process occurs in which the first ligands disposed on the plurality of nanostructures are replaced with the second ligands. The plurality of nanostructures is deposited on a substrate to form a layer. The layer is thermally annealed.

Another innovative aspect of the subject matter described in this disclosure can be implemented in a method including providing a plurality of nanostructures. The plurality of nanostructures comprises a thermoelectric material, with each nanostructure of the plurality of nanostructures having first ligands disposed on a surface of the nanostructure. The plurality of nanostructures is deposited on a substrate to form a layer. The layer is contacted with a solution containing second ligands and a ligand exchange process occurs in which the first ligands disposed on the plurality of nanostructures are replaced with the second ligands. The layer is thermally annealed.

Another innovative aspect of the subject matter described in this disclosure can be implemented in a material including a plurality of nanostructures. The plurality of nanostructures comprises a thermoelectric material. Nanostructures of the plurality of nanostructures have dimensions of less than about 100 nanometers. The material has a thermoelectric figure of merit (ZT) of at least about 0.3.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±10%, ±5%, or ±1%. The term "substantially" is used to indicate that a value is close to a targeted value, where close can mean, for example, the value is within 90% of the targeted value, within 95% of the targeted value, or within 99% of the targeted value.

Figure 1A:
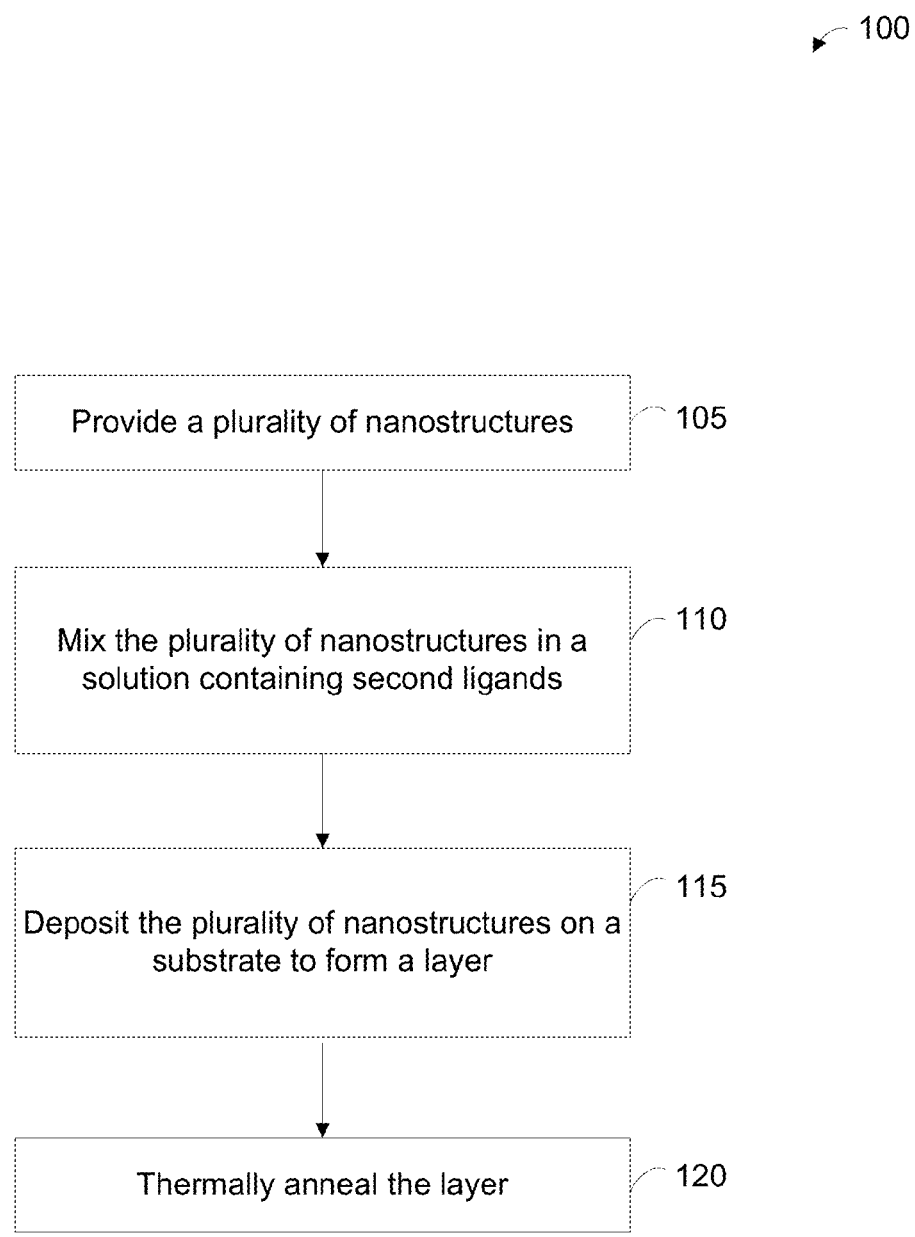
FIGS. 1A and 1B show examples of flow diagrams illustrating manufacturing processes for a nanostructured layer of a thermoelectric material.
Figure 1B:
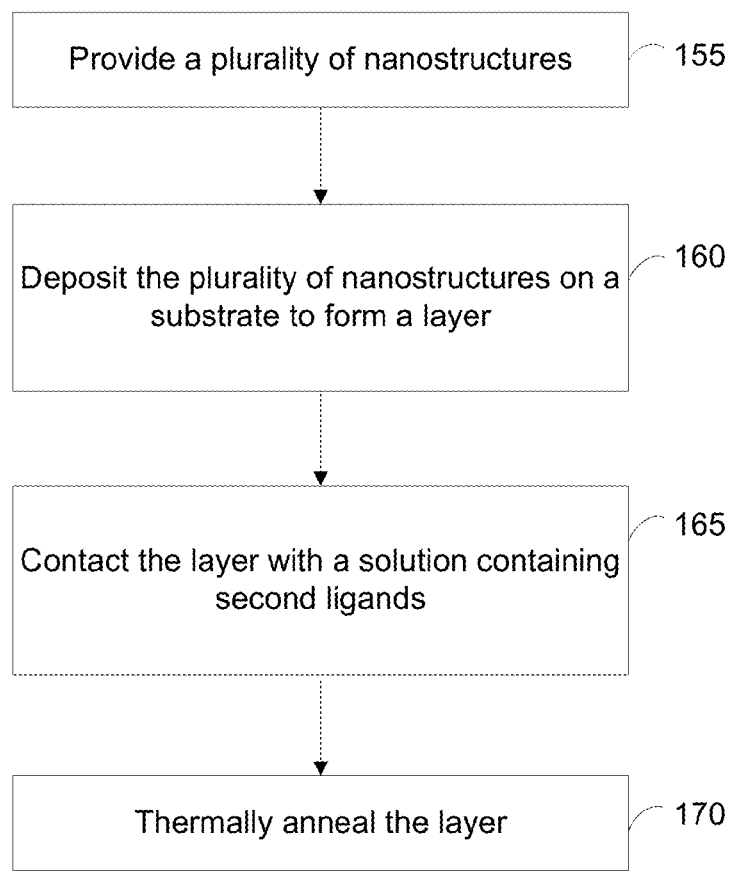
Figure 2A:
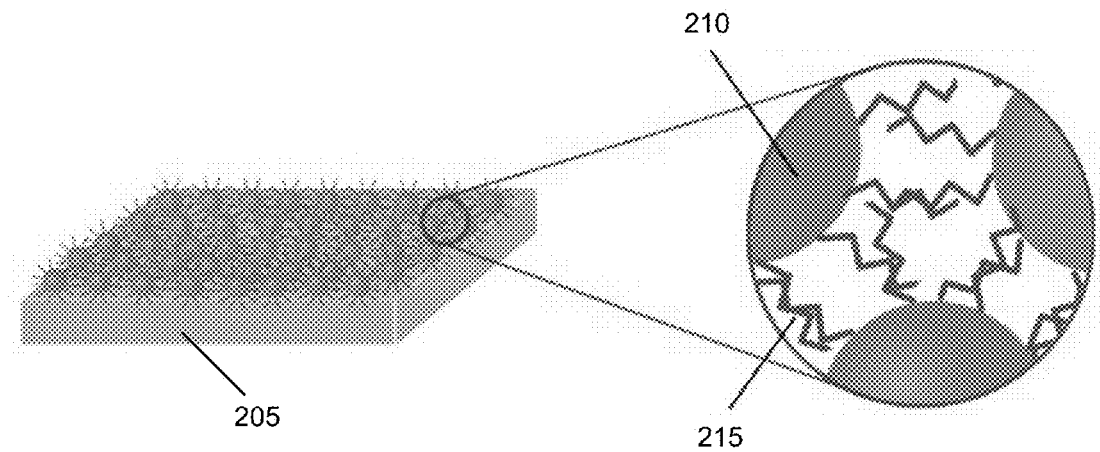
FIGS. 2A and 2B show examples of schematic illustrations of a nanostructured layer of a thermoelectric material at various stages in the manufacturing process.
Figure 2B:
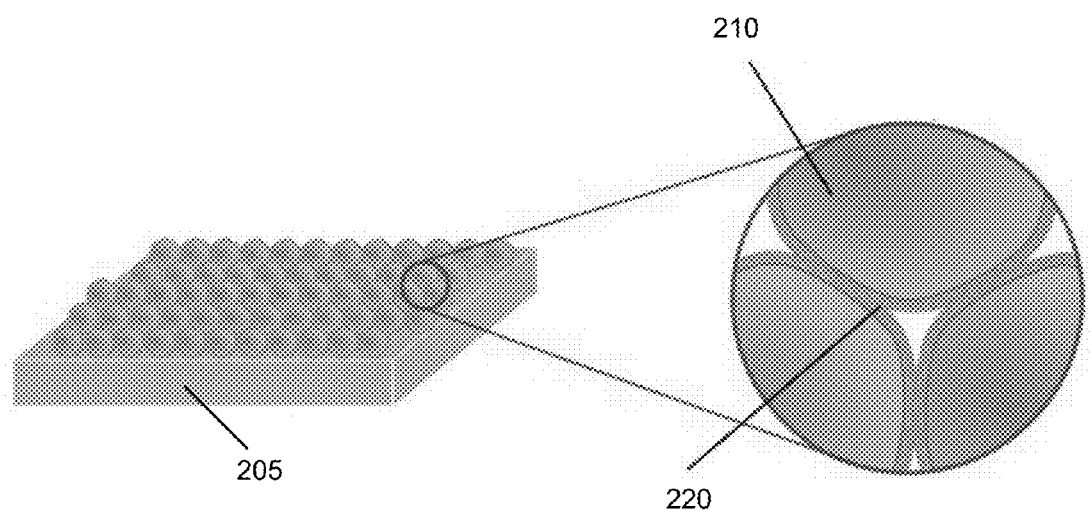

FIGS. 1A and 1B show examples of flow diagrams illustrating manufacturing processes for a nanostructured layer of a thermoelectric material. FIGS. 2A and 2B show examples of schematic illustrations of a nanostructured layer of a thermoelectric material at various stages in the manufacturing process.

Starting at block 105 of the method 100 shown in FIG. 1A, a plurality of nanostructures is provided. In some embodiments, the largest dimension of a nanostructure is about 5 nanometers (nm) to 50 nm. For example, the largest dimension of a spherical nanostructure is the diameter of the nanostructure. In some embodiments, the nanostructures are monodisperse; i.e., in some embodiments, the nanostructures have a narrow size range. In some embodiments, the nanostructures comprise nanostructures selected from a group consisting of nanorods, nanowires, nanoparticles, nanosheets, nanoplates, and quantum dots. In some embodiments, the nanostructures comprise nanoparticles. In some embodiments, the nanostructures comprise copper selenide ($Cu_2Se$), copper telluride, copper sulfide, bismuth selenide, bismuth telluride, bismuth sulfide, lead selenide, lead telluride, lead sulfide, bismuth, tellurium, silicon, silver telluride, silver selenide, antimony selenide, antimony telluride, or alloys thereof. In some embodiments, the nanostructures comprise a nonstoichiometric composition. For example, the nanostructures may comprise $Cu_{2-x}Se$, with x generally being about 0.01 and 0.20. In some embodiments, after the nanostructures are fabricated, each nanostructure of the plurality of nanostructures has ligands disposed on a surface of the nanostructure. For example, the ligands generally may comprise amines, phosphines, phosphonic acids, phosphine oxides, or carboxylic acids. For example, the ligands may comprise oleylamine, oleic acid, octylamine, hexylamine, trioctylphosphine, tributylphosphine, trioctylphosphine oxide, hexadecylamine, octadecylamine, dodecylphosphonic acid, or tetradecylphosphonic acid.

In some embodiments, the nanostructures are fabricated by mixing a first solution a metal salt in an organic solvent with a second solution of a chalcogen (e.g., sulfur, selenium, tellurium) in an organic solvent. In some embodiments, the metal salt comprises a copper salt (e.g., copper chloride, copper nitrate, copper sulfate, copper acetate, copper acetylacetonate, copper methoxide, copper ethylhexanoate, copper tetrafluoroacetate, copper hexafluoroacetylacetonate). In some embodiments, the organic solvent of the first solution is the same as the organic solvent of the second solution. In some embodiments, the organic solvent of the first solution and the organic solvent of the second solution are miscible.

At block 110, the plurality of nanostructures is mixed with a solution containing second ligands. A ligand exchange process occurs in which the first ligands disposed on the plurality of nanostructures are replaced with second ligands. In some embodiments, the first ligands have a longer chain length than the second ligands. For example, in some embodiments, the first ligands are long, insulating ligands that are useful for solubilizing the nanostructures, and the second ligands are shorter ligands. The second ligands may allow the nanostructures to pack closer together when the nanostructures are deposited a substrate. In some embodiments, the second ligands comprise ethanedithiol, ethylenediamine, succinic acid, propionic acid benzenedithiolate, benzenediamine, hydrazine, ammlonium thiocyanate, sodium hydroxide, potassium hydroxide, sodium sulfide, potassium sulfide, sodium hydrosulfide, potassium hydrosulfide, ammonium sulfide, sodium telluride, potassium telluride, sodium hydrotelluride, potassium hydrotelluride, sodium selenide, sodium hydroselenide, potassium selenide, potassium hydroselenide, nitrosonium tetrafluoroborate, mercaptopropionic acid, formic acid, chalcogenidometallates (ChaMs), or polyoxometalates (POMs).

At block 115, the plurality of nanostructures is deposited on a substrate to form a layer of nanostructures. In some embodiments, the nanostructures are deposited on the substrate using a solution processing technique. For example, solution processing techniques include spin coating, dip coating, spray coating, doctor blade, and inkjet printing. In some embodiments, the substrate comprises a silicon substrate or a glass substrate. In some embodiments, the as-deposited layer of nanostructures has a thickness of about 50 nm to 200 nm. In some embodiments, the layer of nanostructures is disposed on about 1 centimeter (cm) by 1 cm of the substrate surface.

In some embodiments, the ligand exchange process occurs at block 115. For example, the plurality of nanostructures can be mixed with the solution containing the second ligands during the deposition process.

In some embodiments, block 115 is repeated to generate a layer of nanostructures having a specified thickness. For example, block 115 is performed to form a first layer of nanostructures. Block 115 could then be repeated to form a second layer of nanostructures disposed on the first layer of nanostructures.

In some embodiments, $Cu_2Se$ nanoparticles mixed in hexane and octane are deposited on a substrate using spin coating. The spacing, electronic coupling, and thermal coupling between nanoparticles in the layer are mediated by the ligands attached to the $Cu_2Se$ nanoparticles. Typical thermoelectric properties of a non-annealed layer were electrical conductivity of 0.03 S/cm, thermal conductivity of 0.4 W/m×K, and Seebeck coefficient of $10^{-4}$ V/K.

FIG. 2A shows an example of schematic illustrations of a nanostructured layer of a thermoelectric material after block 115. As shown in FIG. 2A, a plurality of nanostructures 210 is disposed on a substrate 205. The second ligands 215 attached to surfaces of each nanostructure of the plurality of nanostructures control the spacing between the nanostructures.

At block 120, the layer of nanostructures is thermally annealed. In some embodiments, the thermal annealing is performed at a temperature of about 50° C. to 600° C. In some embodiments, the thermal annealing is performed at a temperature at or below about 500° C. In some embodiments, the thermal annealing is performed at a temperature of about 300° C. or about 400° C. In some embodiments, the thermal annealing is performed for about 15 minutes to 1 hour, or about 45 minutes. In some embodiments, the thermal annealing is performed in air. In some embodiments, the thermal annealing is performed in a specified atmosphere, such as an inert atmosphere. For example, in some embodiments, the thermal annealing is performed in an atmosphere comprising a gas selected from a group consisting of nitrogen, argon, hydrogen, oxygen, and mixtures thereof.

In some embodiments, the thermal annealing removes at least some of the second ligands from the surface of each nanostructure of the plurality of nanostructures. In some embodiments, the thermal annealing removes all of the second ligands from the surface of each nanostructure of the plurality of nanostructures. In some embodiments, some of the surfaces of the nanostructures are in contact with each other after the thermal annealing. For example, a thermoelectric material surface of a first nanostructure may be in contact with a thermoelectric material surface of a second nanostructure. In some embodiments, the thermal annealing modifies the second ligands and the modified second ligands form a layer of a material on a surface of each nanostructure of the plurality of nanostructures. For example, during the thermal annealing, the second ligands may become mobile and form a layer of ligand molecules on a surface of each nanostructure of the plurality of nanostructures. In some embodiments, after the annealing, the layer of nanostructures has a thickness of about 25 nm to 100 nm, or about 75 nm. In some embodiments, after the annealing, the nanostructures have dimensions of about 100 nm or less. In some embodiments, after the annealing, the layer of nanostructures has a thermoelectric figure of merit (ZT) of at least about 0.3 or at least about 1.

In some embodiments, a $Cu_2Se$ nanoparticle layer is thermally annealed by placing the substrate with a $Cu_2Se$ nanoparticle layer disposed thereon in an oven with temperature set below about 500° C. for about 45 minutes in a nitrogen atmosphere. The thermal annealing results in modification and/or decomposition of the original ligand. Further, the $Cu_2Se$ nanoparticles may change shape and/or sinter.

FIG. 2B shows an examples of schematic illustrations of a nanostructured layer of a thermoelectric material after block 120. As shown in FIG. 2B, the plurality of nanostructures 210 is disposed on a substrate 205. The second ligands 215 that were attached to the surfaces of the nanostructures are modified to form a layer of a material 220 on a surface of each nanostructure 210 of the plurality of nanostructures.

Typical thermoelectric properties of a $Cu_2Se$ nanoparticle layer annealed at 200° C. were electrical conductivity of 150 S/cm, thermal conductivity of 0.9 W/m×K, and Seebeck coefficient of $10^{-4}$ V/K. The highest power factor of a $Cu_2Se$ nanoparticle layer was about 730 μ W/mK$^2$ at room temperature, which is comparable to the power factor of dense, spark plasma sintering (SPS) copper selenide at room temperature.

FIG. 1B shows an example of a flow diagram illustrating a manufacturing process for a nanostructured layer of a thermoelectric material. In some embodiments, the operations of the method 150 shown in FIG. 1B are similar to the operations of the method 100 shown in FIG. 1A.

Starting at block 155 of the method 150, a plurality of nanostructures is provided. In some embodiments, the same operation performed at block 105 shown in FIG. 1A is performed at block 155. For example, the nanostructures may comprise copper selenide, copper telluride, bismuth selenide. bismuth telluride, lead selenide, lead telluride, bismuth, or tellurium.

At block 160, the plurality of nanostructures is deposited on a substrate to form a layer of nanostructures. In some embodiments, the same operation performed at block 115 shown in FIG. 1A is performed at block 160. For example, the plurality of nanostructures may be deposited with a solution processing technique.

At block 165, the layer of nanostructures is contacted with a solution containing the second ligands. In some embodiments, the layer of nanostructures is contacted with the solution containing the second ligands for about 15 seconds to 2 minutes, or about 30 seconds. When the solution is in contact with the layer of nanostructures, a ligand exchange occurs in which first ligands disposed on a surface of the each of the nanostructures are replaced with second ligands. In some embodiments, the solution containing the second ligands is removed from contact with the layer of nanostructures using a physical technique (e.g., spinning the substrate to remove the solution with a centrifugal force) or a solvent.

In some embodiments, blocks 160 and 165 are repeated to generate a layer of nanostructures having a specified thickness. For example, blocks 160 and 165 are performed to form a first layer of nanostructures. Blocks 160 and 165 could then be repeated to form a second layer of nanostructures disposed on the first layer of nanostructures.

At block 170, the layer of nanostructures is thermally annealed. In some embodiments, the same operation performed at block 120 shown in FIG. 1A is performed at block 170. For example, the thermal annealing may be performed at a temperature of about 50° C. to 600° C.

The methods 100 (FIG. 1A) and 150 (FIG. 1B) have advantages over energy intensive SPS techniques. For example, with SPS techniques, samples can be produced by heating copper and selenium shot in a tube furnace to about 1150° C. for about 12 hours followed by an about 7 day hold at 800° C. This thermal processing is followed by powdering (i.e., reducing the material to a powder). The powder is then subjected to SPS at about 437° C. under about 65 MPa of pressure.

The nanostructured layers of a thermoelectric material described herein are applicable to both power generation applications and active cooling applications.

EXAMPLES

The following examples are intended to be examples of the embodiments disclosed herein, and are not intended to be limiting.

Copper selenide ($Cu_{2-x}Se$) nanocrystals were synthesized following a modified version of the method described in Kriegel, I. et al., Tuning the Exitonic and Plasmonic Properties of Copper Chalcogenide Nanocrystals, *J. Am. Chem. S.* 134, 1583-1590 (2012). Briefly, a solution of copper (I) chloride in oleylamine (OAm) and 1-octadecene (ODE) was injected into a solution of selenium dissolved in the same solvents at a temperature of 310° C. The reaction was allowed to proceed for 20 minutes at 300° C. 11.8±1.1 nm diameter nanocrystals were formed. The nanocrystals were washed by precipitating with ethanol and resuspending in hexane twice. The nanocrystals were kept in hexane for future use.

Ligand-exchanged thin films of $Cu_{2-x}Se$ were prepared by spin coating sub-monolayers of OAm-coordinated nanocrystals from a solution of hexane and octane. After each deposition of OAm-coordinated NCs, 60 μL of an ethanedithiol (EDT) solution (1% by volume in acetonitrile, ACN) was pipetted onto the film. The EDT solution was left in contact with the film for approximately 30 seconds while the original OAm ligands were exchanged for the smaller EDT ligands. After the ligand exchange step, the film was spun to remove the excess solution and was rinsed once with neat ACN. As a result of the ligand exchange, the nanocrystals in the film were no longer soluble in the original non-polar solvents, allowing for multiple depositions of OAm-coordinated NCs to reach a specified thickness.

After deposition, the films were annealed at different temperatures. 100 nm thick gold contacts were then deposited at the corners of the films via thermal evaporation. Following contact deposition, a series of measurements were made on the films to characterize their electrical and thermal properties, the results of which are set forth in FIGS. 3A-3D, 4A-4J, and 5A-5D. DC electrical conductivity was determined via the van der Pauw method. Thermopower was determined by applying a temperature gradient across the film and measuring the steady state open circuit voltage. Cross-plane thermal conductivity was measured by time domain thermal reflectance (TDTR).

Figure 3A:
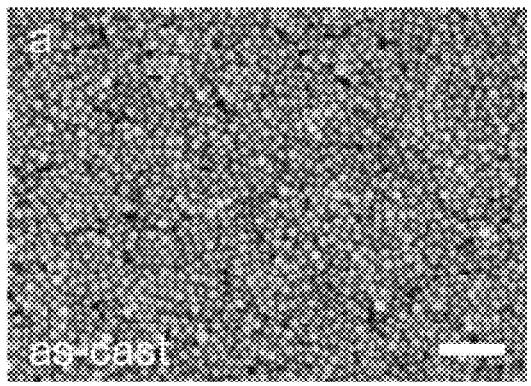
FIGS. 3A-3D show examples of scanning electron microscopy (SEM) images of a layer of $Cu_{2-x}Se$ nanoparticles.
Figure 3C:
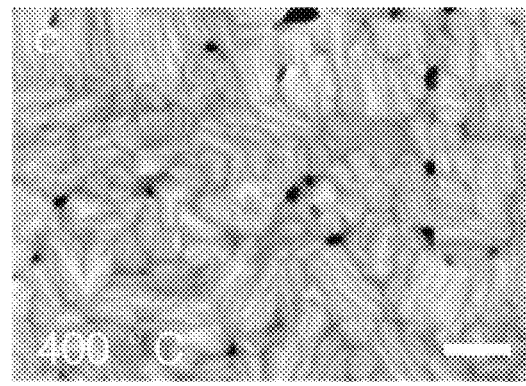
Figure 3B:
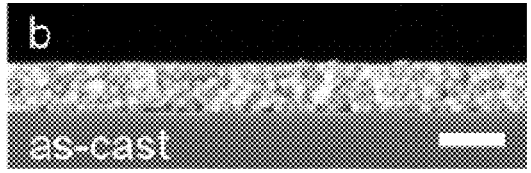
Figure 3D:
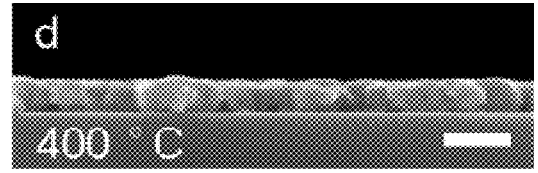

FIGS. 3A-3D show examples of scanning electron microscopy (SEM) images of a layer of $Cu_{2-x}Se$ nanoparticles. FIG. 3A shows an example of a top-view SEM image of an as-cast thin film composed of $Cu_{2-x}Se$ nanoparticles. The film was deposited in three spin casting steps. After each step the original oleylamine ligands were replaced with ethanedithiol ligands. FIG. 3B shows an example of a cross-sectional SEM image of the film shown in FIG. 3A. The film is approximately 75 nm thick. FIG. 3C shows an example of a top-view SEM image of a $Cu_{2-x}Se$ thin film after annealing at 400° C. for 45 minutes. Prior to annealing, this film was prepared the same way as the film shown in FIG. 3A. FIG. 3D shows an example of a cross-sectional SEM image of the film shown in FIG. 3C. The film is approximately 54 nm thick. The scale bars in all images shown in FIGS. 3A-3D are 100 nm.

Figure 4A:
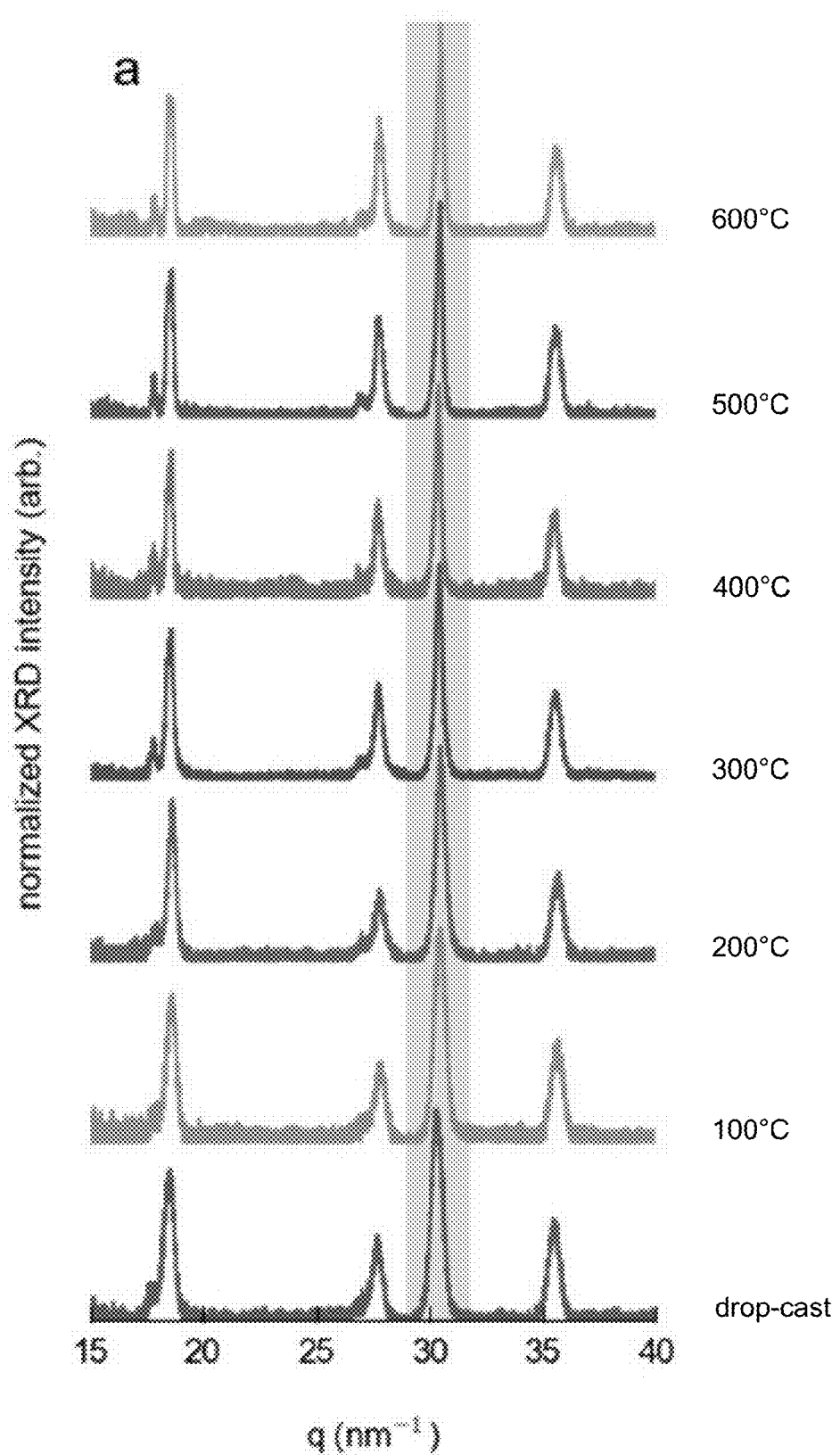
FIGS. 4A-4J show examples of the results of the structural characterization of layers of $Cu_{2-x}Se$ nanoparticles.
Figure 4B:
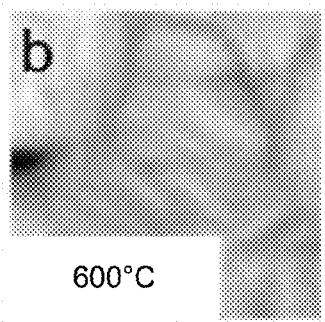
Figure 4C:
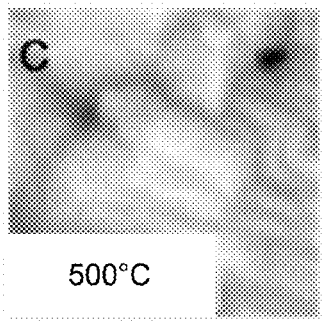
Figure 4D:
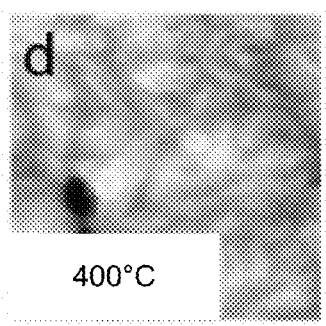
Figure 4E:
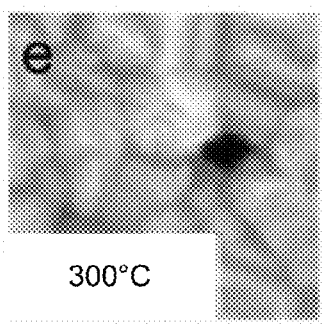
Figure 4F:
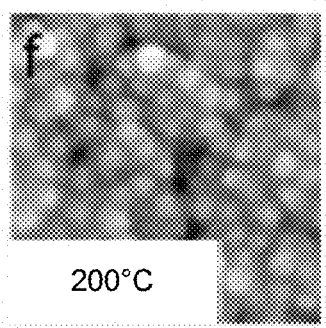
Figure 4G:
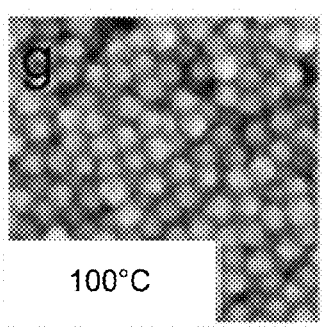
Figure 4H:
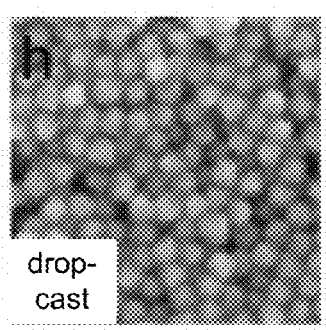
Figure 4I:
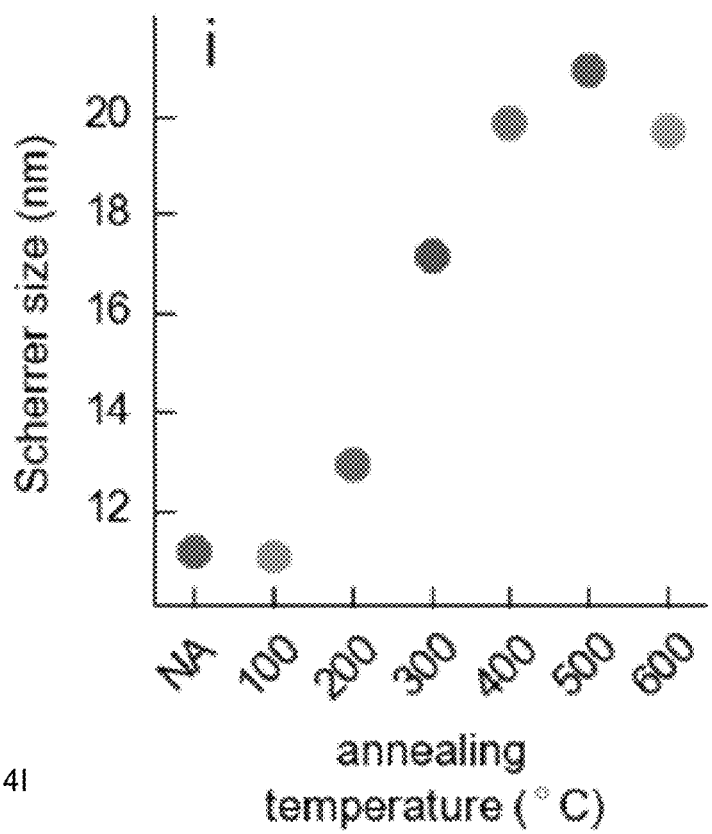
Figure 4J:
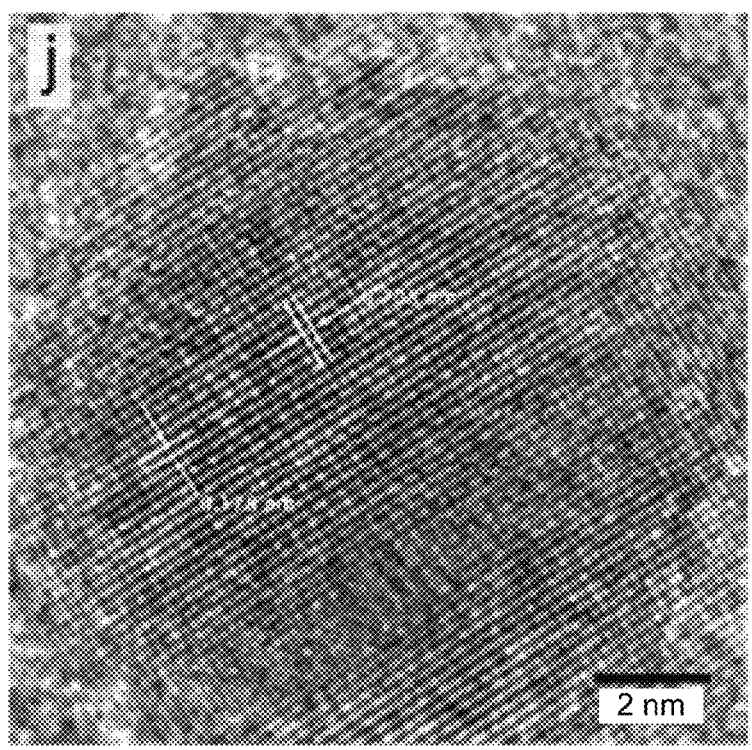

FIGS. 4A-4J show examples of the results of the structural characterization of layers of $Cu_{2-x}Se$ nanoparticles. FIG. 4A shows examples of x-ray diffraction (XRD) spectra for drop-cast and annealed films of $Cu_{2-x}Se$. The low-temperature structure is maintained after annealing. FIGS. 4B-4H shows examples of top-view SEM images of thin films that were annealed at the same temperature as the drop-cast samples used for generating the XRD spectra shown in FIG. 4A. FIG. 4I shows an example the results of a crystal size analysis. Crystal size of the nanocrystals in the films was determined by fitting the highlighted peak at $q\sim30$ $nm^{-1}$ in FIG. 4A with a Voigt profile and using the Scherrer formula. FIG. 4J shows an example of a high resolution transmission electron microscopy (TEM) image of a $Cu_{2-x}Se$ nanocrystal.

Figures 5A, 5B, 5C, 5D:
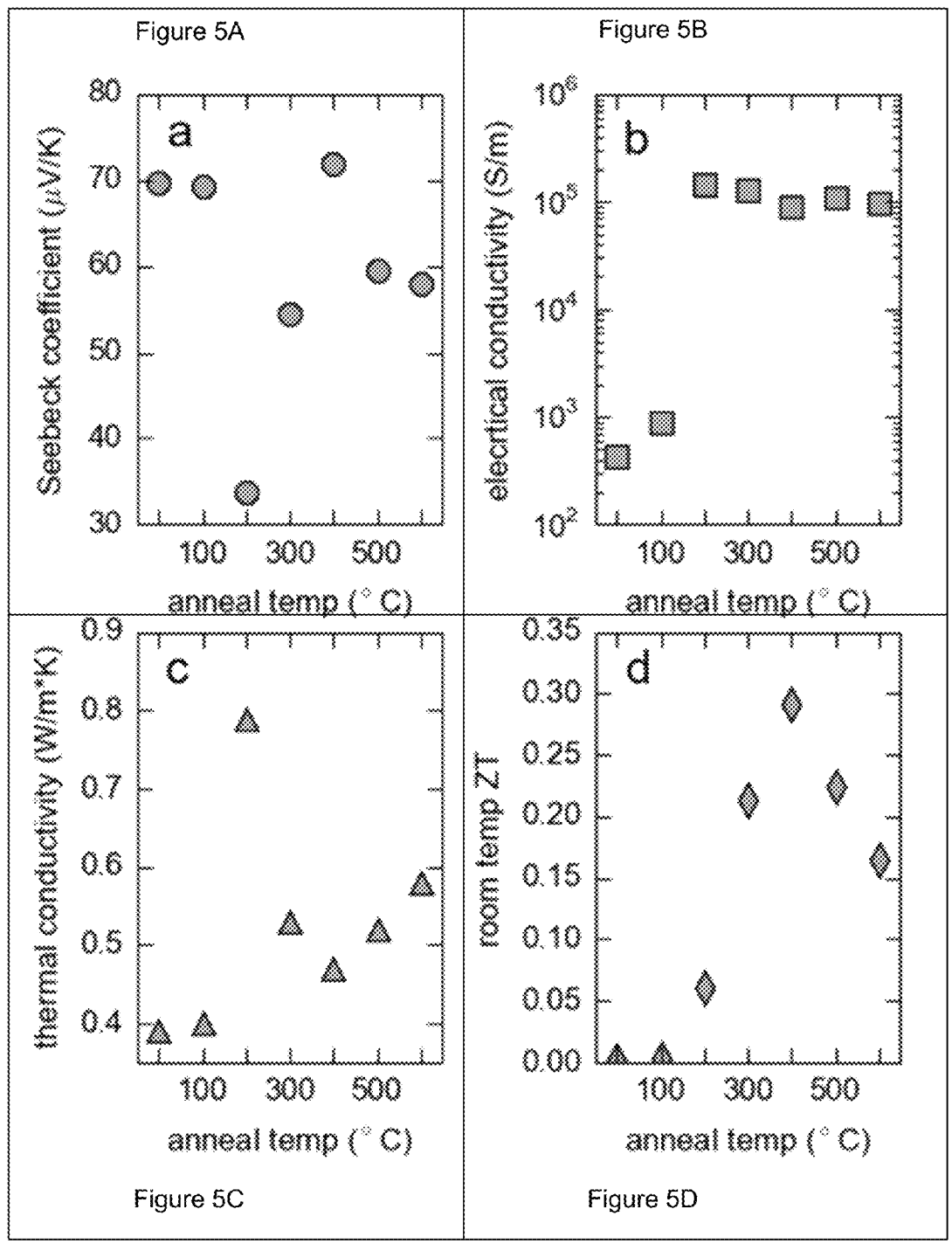
FIGS. 5A-5D show examples of plots showing the transport properties of layers of $Cu_{2-x}Se$ nanoparticles as a function of annealing temperature.

FIGS. 5A-5D show examples of plots showing the transport properties of layers of $Cu_{2-x}Se$ nanoparticles as a function of annealing temperature. FIG. 5A shows the Seebeck coefficient of thin films of $Cu_{2-x}Se$. FIG. 5B shows the electrical conductivity of thin films of $Cu_{2-x}Se$. FIG. 5C shows the thermal conductivity, as determined by time domain thermal reflectance, of thin films of $Cu_{2-x}Se$. FIG. 5D shows the thermoelectric figure of merit, ZT, at room temperature, of thin films of $Cu_{2-x}Se$.

Conclusion

Further details regarding the methods and materials described herein can be found in J. Lynch et al., "Ligand Coupling Symmetry Correlates with Thermopower Enhancement in Small-Molecule/Nanocrystal Hybrid Materials," ACS Nano, 2014, 8 (10), pp 10528-10536, which is herein incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A method comprising:
   (a) providing a plurality of nanostructures, the plurality of nanostructures comprising a thermoelectric material, each nanostructure of the plurality of nanostructures having first ligands disposed on a surface of the nanostructure;
   (b) mixing the plurality of nanostructures with a solution containing second ligands and a ligand exchange process occurring in which the first ligands disposed on the plurality of nanostructures are replaced with the second ligands;
   (c) depositing the plurality of nanostructures on a substrate to form a layer; and
   (d) thermally annealing the layer.

2. The method of claim 1, wherein the plurality of nanostructures comprises nanostructures selected from a group consisting of nanorods, nanowires, nanoparticles, and quantum dots.

3. The method of claim 1, wherein the first ligands comprise oleylamine ligands.

4. The method of claim 1, wherein the plurality of nanostructures comprises $Cu_2Se$ or $Cu_{2-x}Se$.

5. The method of claim 1, wherein operation (c) is performed with a solution processing technique.

6. The method of claim 5, wherein the solution processing technique is selected from a group consisting of spin coating, dip coating, spray coating, doctor blade, and inkjet printing.

7. The method of claim 1, wherein the substrate comprises a silicon substrate or a glass substrate.

8. The method of claim 1, wherein the second ligands comprise ethanedithiol ligands.

9. The method of claim 1, wherein the first ligands have a longer chain length than the second ligands.

10. The method of claim 1, wherein during the thermal annealing all of the second ligands are removed from the surface of each nanostructure of the plurality of nanostructures.

11. The method of claim 1, wherein during the thermal annealing at least some of the second ligands are removed from the surface of each nanostructure of the plurality of nanostructures.

12. The method of claim 1, wherein the thermal annealing is performed at a temperature below about 500° C.

13. The method of claim 1, wherein the thermal annealing is performed for about 15 minutes to 1 hour.

14. The method of claim 1, wherein the thermal annealing is performed in an atmosphere comprising a gas selected from a group consisting of nitrogen, argon, hydrogen, air, and mixtures thereof.

15. The method of claim 1, wherein after the thermal annealing, a thermoelectric material surface of a first nanostructure is in contact with a thermoelectric material surface of a second nanostructure.

16. The method of claim 1, wherein after the thermal annealing, the layer has a thermoelectric figure of merit (ZT) of at least about 0.3.

17. A method comprising:
(a) providing a plurality of nanostructures, the plurality of nanostructures comprising a thermoelectric material, each nanostructure of the plurality of nanostructures having first ligands disposed on a surface of the nanostructure;
(b) depositing the plurality of nanostructures on a substrate to form a layer;
(c) contacting the layer with a solution containing second ligands and a ligand exchange process occurring in which the first ligands disposed on the plurality of nanostructures are replaced with the second ligands; and
(d) thermally annealing the layer.

18. The method of claim 17, wherein the plurality of nanostructures comprises $Cu_2Se$ or $Cu_{2-x}Se$, wherein the first ligands comprise oleylamine ligands, and wherein the second ligands comprise ethanedithiol ligands.

19. The method of claim 17, wherein after the thermal annealing, the layer has a thermoelectric figure of merit (ZT) of at least about 0.3.

* * * * *